United States Patent [19]
Ono et al.

[11] Patent Number: 5,458,702
[45] Date of Patent: Oct. 17, 1995

[54] ALLOY POWDER, DISPERSION-TYPE CONDUCTOR USING THE SAME

[75] Inventors: Yasuichi Ono, Furukawa; Akihiro Makino, Nagaoka; Akihisa Inoue, Kawauchi-jutaku, Kawauchi Mubanchi, Aoba-ku, Sendai-shi, Miyagi-ken; Tsuyoshi Masumoto, 8-22 3-chome, Kamisugi, Sendai-shi, Miyagi-ken; Yoshio Harakawa, Okaya, all of Japan

[73] Assignees: Alps Electric Co., Ltd.; Teikoku Piston Ring Co., Ltd., both of Tokyo; Akihisa Inoue, Sendai; Tsuyoshi Masumoto, Okaya, all of Japan

[21] Appl. No.: 82,192

[22] Filed: Jun. 24, 1993

[30] Foreign Application Priority Data

Jun. 30, 1992 [JP] Japan .................................... 4-173187

[51] Int. Cl.$^6$ .................................................... C22C 9/00
[52] U.S. Cl. ............................ 148/432; 75/247; 252/514; 420/497
[58] Field of Search ............................ 420/497; 148/432; 75/231, 247; 252/514

[56] References Cited

U.S. PATENT DOCUMENTS 4,891,068 1/1990 Masumoto et al. ..................... 148/403
5,091,114 2/1992 Nakajima et al. ....................... 252/514
5,198,154 3/1993 Yokoyama et al. ..................... 252/514
5,242,511 9/1993 Yokoyama et al. ..................... 420/497

FOREIGN PATENT DOCUMENTS

470262A1  2/1992  European Pat. Off. .
62-247040 10/1987 Japan .
5-005141  1/1993  Japan .

OTHER PUBLICATIONS

Hansen, M., *Constitution of Binary Alloys*, pp. 18–19, McGraw–Hill, 1958.

*Primary Examiner*—George Wyszomierski
*Attorney, Agent, or Firm*—Guy W. Shoup; Patrick T. Bever

[57] ABSTRACT

Alloy powder which is low in price and is unlikely to be oxidized on the surface, and a dispersion-type conductor using the alloy powder in which electromigration is not likely to occur. Melt of copper and silver is cooled at a high cooling speed of $10^{5°}$ C./s or higher. Alloy powder having a composition expressed by a chemical formula $Cu_x Ag_{1-x}$ (where $0.80 \leq X \leq 0.99$) is obtained. Also, a dispersion-type conductor is produced by dispersing 100 parts by weight of the alloy powder in between 5–100 parts by weight of a binder. Thus, the low-priced alloy powder and the dispersion-type conductor of high quality and high reliability can be obtained.

2 Claims, 9 Drawing Sheets

ALLOY POWDER, DISPERSION-TYPE CONDUCTOR USING THE SAME

BACKGROUND OF THE INVENTION

1. Field of the Invention

The present invention relates to conductive alloy powder and a dispersion-type conductor produced by dispersing the alloy powder in a binder, and is applicable to electromagnetic-wave shielding materials, membrane switches, circuit substrates and electronic parts.

2. Description of the Related Art

Conventionally, conductive powders such as carbon black powder, noble metal powder formed of, such materials as gold, silver and palladium, base metal powder formed of, such materials as copper and nickel, and alloys consisting of these metals are known. Dispersion-type conductors produced by dispersing such conductive powder in organic or inorganic binders are also known. Further, a method of producing such a known dispersion-type conductor is generally as follows. The conductive powder and a binder are kneaded, and a solvent and an additive are added thereto if necessary, so as to produce paste or paint. Such paste or paint is applied by a known method, such as a screen printing, and then thermally treated and solidified. As a result, a coat of the dispersion-type conductor is formed.

Carbon black represented by the conventional conductive powder for a dispersion-type conductor has low conductivity so that a dispersion-type conductor having low resistance cannot be obtained by using such powder. Also, since the base metal powder such as copper, nickel, or the like is likely to be oxidized on the surface, the electric resistance is raised in the contact area among the grains of the metal powder, and thus the resistivity of the dispersion-type conductor using such metal powder cannot be lowered as desired although the electric resistance inherent in the metal is low. Further, noble metal such as gold, silver, platinum, palladium, or the like, and the powder of these alloys are less likely to be oxidized on the surface, and thus the use of such powders for the dispersion-type conductor makes it possible to lower the resistivity of the conductor. However, since the noble metal is expensive, the dispersion-type conductor is also costly. In general, silver powder, which metal is less costly than other noble metals, is currently used for the dispersion-type conductor. However, if voltage is applied to such dispersion-type conductor when water is present between a pair of conductors separate from each other, the silver is ionized in a dispersion-type conductor having a positive potential by an electrochemical reaction, and is transferred to another conductor having a negative potential and is precipitated therein; what is called, electromigration, is likely to occur. If the electromigration continues for quite a while, the precipitated silver expands from being a conductor having a negative potential to a conductor having a positive potential, which deteriorates the insulation between the conductors and even brings about short-circuiting thereof.

Recently, silver alloy powder obtained by employing a high-pressure atomizing method and a conductor using such silver alloy powder have been proposed with a view to overcoming the above-mentioned drawbacks of the conductive powder. The details of such silver alloy powder and a conductor using the same are disclosed in Japanese Patent Laid-Open Nos. 3-245404 and 3-245405. A common object of these inventions is to provide silver alloy powder and a conductive paste using such powder which are excellent in characteristics such as conductivity, oxidation resistance, and anti-migration of silver. An object of the invention disclosed in Japanese Patent Laid-Open No. 3-0245404 is further to provide conductive paste which is low in price. These inventions are provided on the basis of a conventional theory of combining silver and a base metal by utilizing the advantages of both metals effectively and compensating for the shortcomings thereof. Also, one of the features of these inventions is that metal powder is transformed into an alloy by employing a high-pressure atomizing method, thereby obtaining a remarkable effect. The high-pressure atomizing method is employed by the following process. Melt having a desired composition is ejected into an inert gas atmosphere, and concurrently, high-speed gas generated by the method of adiabatic-expansion of highly-pressurized inert gas is ejected on the melt so as to quench and solidify the melt. A description is not fully given in such patent publications of what sort of characteristics will arise within the alloy by employing the high-pressure atomizing method. However, Japanese Patent Laid-Open No. 3-245404 discloses that the silver concentration is gradually increased toward the surface of the powder in a particular region. It also proves that this is because a liquid phase full of a silver component having a low melting point appears on the surface of the powder in the process of solidifying the powder by quenching, and such phase is delayed from being solidified in comparison to other regions, which results in the silver concentration on the surface.

The alloy powder produced by employing the high-pressure atomizing method has better characteristics than the conductive powder theretofore, but it is not yet industrially satisfactory to a sufficient extent.

SUMMARY OF THE INVENTION

In view of the foregoing problems of the related art, an object of the present invention is to provide conductive alloy powder which is economical and unlikely to be oxidized on the surface, and which inhibits electromigration when such alloy powder is used for a dispersion-type conductor, and to provide a useful dispersion-type conductor utilizing such alloy powder.

To this end, the present invention provides alloy powder produced by cooling melt of copper and silver at a high cooling speed of $10^{5°}$ C./s or higher and which alloy powder has a composition ratio expressed by a chemical formula $Cu_x Ag_{1-x}$ $0.80 \leq X \leq 0.99$. Also, the present invention provides a dispersion-type conductor achieved by dispersing 100 parts by weight of the alloy powder in between 5–100 parts by weight of a binder.

The alloy powder of the present invention constructed as stated above has the following features. The alloy powder has a homogeneous structure in which copper is supersaturated with silver dissolved therein since the alloy droplets are super-quenched in a process of producing the alloy powder. Thus, the alloy powder of the present invention is unlikely to be oxidized compared to the conventional alloy powder having no homogeneous structure which is produced by the high-pressure atomizing method. The alloy powder of the present invention is hardly oxidized particularly in the vicinity of the surface thereof though the copper content of the alloy powder is much higher than that of the conventional alloy powder. Also, the alloy powder contains silver as described above. However, electromigration is unlikely to be caused to the dispersion-type conductor using such alloy powder because copper is supersaturated with silver dissolved therein in the alloy powder. Further, in comparison with a dispersian-type conductor using the conventional alloy powder produced by the high-pressure atomizing method, electromigration is hardly caused because the alloy powder used for the dispersion-type conductor of the present invention has a homogeneous structure in which copper is supersaturated with silver dissolved therein.

DESCRIPTION OF THE PREFERRED EMBODIMENTS

A description will be given hereinafter of alloy powder and a dispersion-type conductor using the same according to the present invention.

Figure 8:
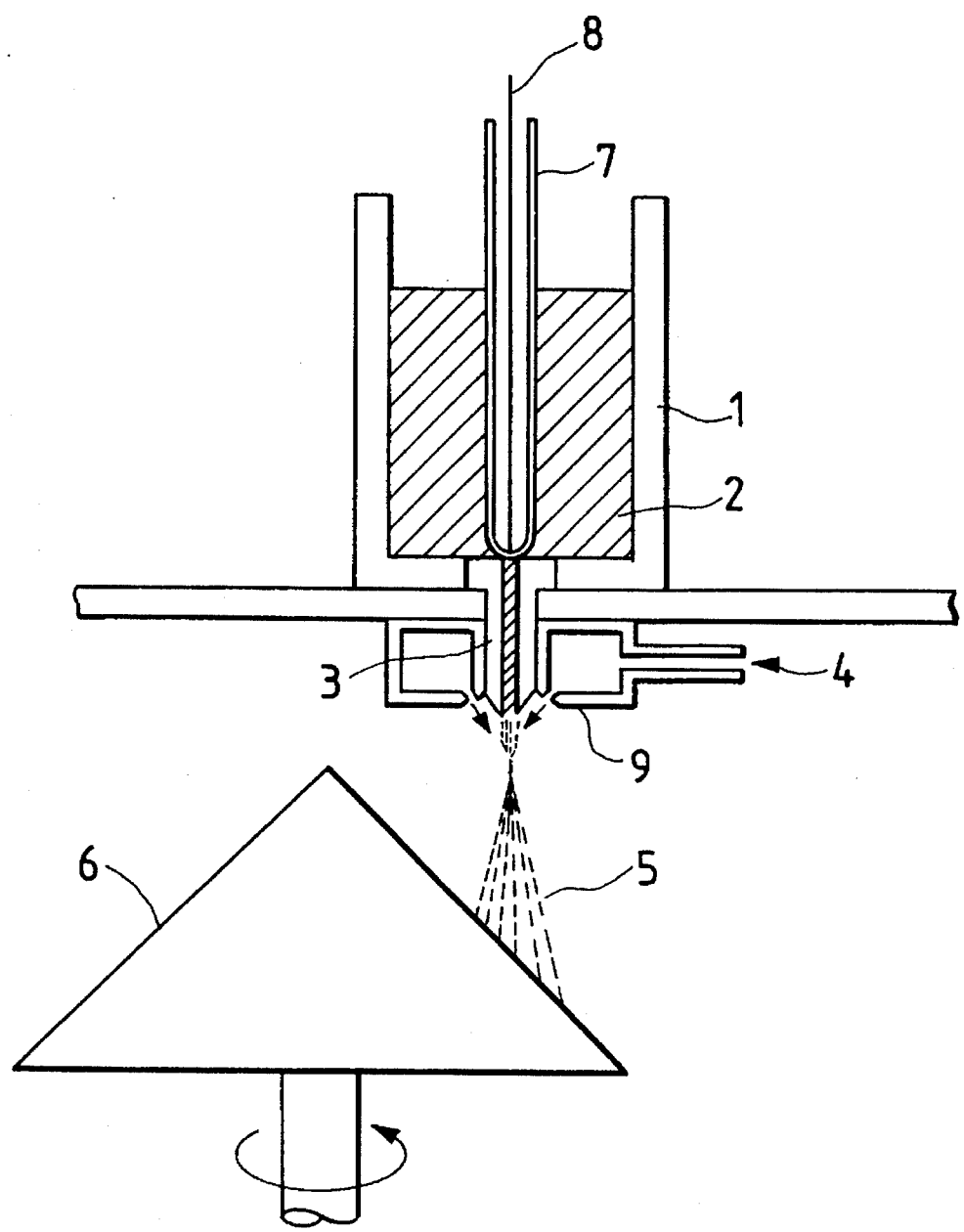
FIG. 8 is an explanatory view of a device used in a two-stage liquid cooling method.

The alloy powder of the present invention is characterized in that it is formed of a supersaturated solid solution having a homogeneous structure. Such a characteristic can be acquired by super-quenching the solid solution at a cooling speed of $10^{5\circ}$ C./s or higher. The alloy powder is produced by employing, for example, a two-stage liquid quenching method in order to achieve such a cooling speed. The ordinary two-stage liquid quenching method will be first explained with reference to FIG. 8 showing a device in which such a method is utilized. A plurality of metals are first mixed in a ratio as desired. Then, they are heated in a crucible 1 by means of heating such as high frequency induction heating, or the like, so as to be transformed into melt 2. Subsequently, the melt 2 is trickled into an inert gas atmosphere from a nozzle 3 under the crucible 1, and concurrently, high-speed gas 4 generated by adiabatic-expansion of the highly-pressurized inert gas is ejected toward the trickled melt 2. Thus, the melt 2 is cooled by the high-speed gas 4 so as to be transformed into alloy droplets 5 (a first-stage cooling), which is also injected downwards at a high speed. The alloy droplets 5 are struck against a cone-shaped rotatable cooling member 6 which is rotated at a high speed so as to be solidified by quenching (a second-stage cooling). As a result, the desired metal powder can be obtained. One of the features of this method is that the high-speed alloy droplets which have been transformed into super-cooled liquid by the first stage cooling can be further cooled at a super-high speed of approximately $10^{4\circ}-^{6\circ}$ C./s by the second stage cooling. Another feature is that the resultant alloy powder can be formed in a flat shape which is further able to be adjusted easily, and the size of the grain can be made somewhat greater. These features distinctly differentiate the two-stage liquid quenching method from an ordinary high-pressure atomizing method. More specifically, the former method can be performed at a higher cooling speed than the latter method. Also, in general, the powder obtained by the latter is substantially spherical, and thus a second working is further required in order to obtain the flat-shaped powder.

Melt of silver and copper in a predetermined composition ratio is solidified by quenching at a cooling speed of $10^{5\circ}$ C./s or higher, and transformed into an alloy having a composition expressed by the following formula: $Cu_x Ag_{1-x}$ $0.80 \leq X \leq 0.99$, whereby the alloy powder of the present invention can be obtained. Within the range of the above-mentioned conditions, the alloy powder is formed of supersaturated solid solution having a homogeneous structure in which copper is supersaturated with silver dissolved therein. In addition, the alloy powder can acquire the characteristics of inhibiting electromigration and oxidation from occurring on the surface. As described above, a cooling speed of $10^{5\circ}$ C./s or higher can be realized by employing the two-stage liquid quenching method. On the other hand, by employing the ordinary high-pressure atomizing method, it is difficult to perform super quenching at such a high speed, and the resultant copper-silver alloy powder cannot be sufficiently formed of the supersaturated solid solution.

It is extremely difficult to measure the actual cooling speed in the two-stage liquid cooling device used for producing the alloy powder of the present invention. Thus, a cooling speed required for producing the alloy powder of the present invention was inferred from an X-ray diffraction pattern of the powder produced in the two-stage liquid cooling device and a ribbon material produced by a single roll method.

Figure 9:
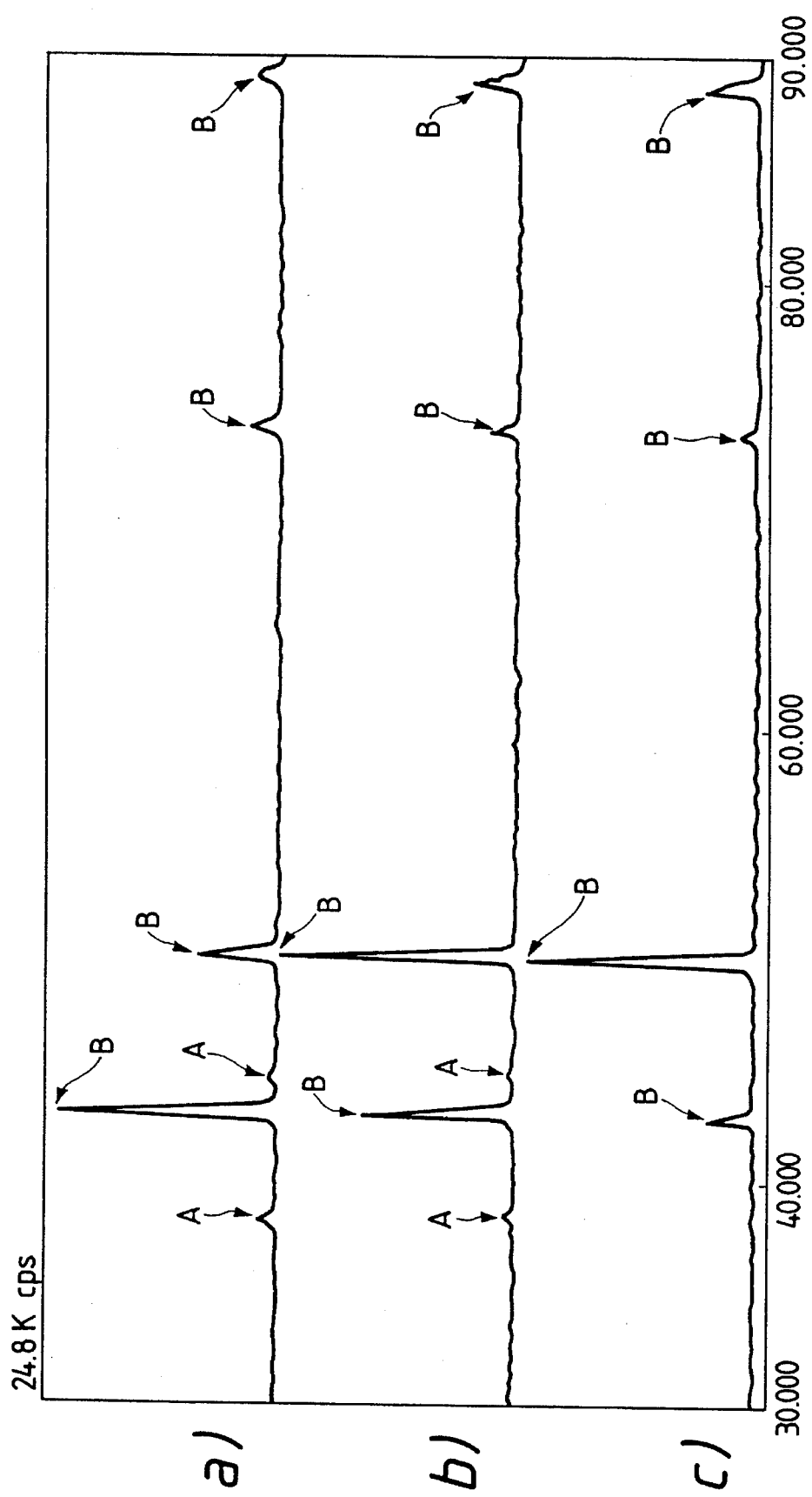
FIG. 9 is a graph showing the shift of an X-ray diffraction pattern of a ribbon material caused by the rotating speed of a roll.

FIG. 9 indicates the shift of the X-ray diffraction pattern of the ribbon material produced by the single roll method depending on the rotating speed of the roll: a), b) and c) show the X-ray diffraction pattern when the rotating speed is 2000 rpms, 3000 rmp and 4000 rpms, respectively. The composition of these samples was $Cu_x Ag_{1-x}$ (X=0.80) when indicated by an atom ratio.

As illustrated in the drawing, a peak representing a phase indicated by A in which silver is supersaturated with copper dissolved therein can be recognized in a) and b) when the rotating speed is 2000 rpms and 3000 rpms, but such a peak disappears in c) when the speed increases up to 4000 rpms. On the other hand, a peak representing a phase indicated by B in which copper is supersaturated with silver dissolved therein shifts at a smaller angle as the rotating speed increases. The value of the cooling speed when the rotating speed was 4000 rpms was $10^{5\circ}$ C./s measured by dendrite arm spacing in another alloy.

That is, the cooling speed is required to be $10^{5\circ}$ C./s or higher in order to obtain the alloy powder having a homogeneous structure in which copper is supersaturated with silver dissolved therein according to the present invention. The powder which is cooled at a lower speed cannot be composed of a homogeneous structure, and a phase of Cu dissolving in Ag even appears.

Even though the cooling speed meets the above-mentioned conditions, if X<0.80 in the chemical formula representing the composition of the alloy powder described above, electromigration characteristics of the alloy powder tend to deteriorate gradually. Such a tendency is detected because the alloy powder is likely to lose its homogeneous structure, thus causing a phase in which copper dissolves in silver to occur in the alloy, which results in an alloy powder which manifests only the characteristics of silver. Even when X<0.80, it is still possible to apply such alloy powder to practical use depending on the intended purposes of use. However, such alloy powder contains a higher ratio of silver, and accordingly, it becomes costly. Thus, the advantages are few. If X>0.99, the characteristics inherent in copper become very distinct, and improvement of the characteristics of the alloy powder cannot be expected.

An average grain size of the alloy powder according to the present invention is between 0.1–300 μm. If the grain size is more than 300 μm, the homogeneity of the alloy powder inherent in a single-phase supersaturated solid solution is inclined to be impaired. If the grain size is less than 0.1 μm, the energy on the surface of the alloy powder increases to a higher level, and thus the surface is likely to be oxidized.

The following are the characteristics added to the alloy powder of the present invention by employing the two-stage liquid cooling method. The alloy powder obtained by employing such a method is formed in a flat shape which is inevitably determined when the alloy droplets strike against the cone-shaped rotatable cooling member and are solidified by quenching. The shape varies depending on the angle which is formed between the alloy droplets and the cone-shaped rotatable cooling member when the former strike against the latter. It changes into a disk shape as the angle is made perpendicular, and changes into an oval shape as the angle is made wider or smaller than a perpendicular angle. The flat-shaped conductive powder has the advantage of reducing the resistance value of a dispersion-type conductor using the conductive powder to a lower level over the spherical conductive powder. This is because the contact area among the grains of the powder is greater when the former powder is used than the latter. The flat-shaped powder cannot be directly obtained by employing a conventional method such as a high-pressure atomizing method, or the like, as previously discussed.

Next, a description will be given of the conditions where the alloy powder of the present invention is produced by employing a two-stage liquid cooling method. The principle of such a method has been discussed previously, and the conditions of cooling are as follows.

The temperature of the melt is maintained between 1100°–1400° C. The pressure of the inert gas before it is adiabatic-expanded is required to be 60 kg/cm² or greater, and more preferably, 80 kg/cm² or greater, The speed of the high-speed gas is preferably 100m/sec or higher at a position where the gas strikes against the melt, and more preferably, 400 m/sec. The ratio of the mass velocity of the gas to the melt is preferably 2 or greater, and more preferably, 4 or greater. The rotating speed of the cone-shaped rotatable cooling member is preferably 1000 rpms or higher and 5000 rpms or lower. The apex of the rotatable cooling member is desirably between 30°–120°. A temperature of the rotatable cooling member is desirably 80° C. or lower.

The inert gas includes, for example, nitrogen, argon, helium, and a mixture of these gasses, and the like. The cone-shaped rotatable cooling member is formed of a copper alloy, on the surface of which chromium is generally plated in order to prevent the alloy droplets from adhering to the surface when they are solidified by quenching.

A description will now be given of embodiments, and the results of analyses and various tests according to the present invention.

EXAMPLE 1

950 g of copper powder (purity of 99.9% or greater) and 50 g of silver powder (purity of 99.9% or greater) were mixed and laid in a graphite crucible of a two-stage liquid cooling device. Then, the resultant mixture was melted by a high frequency induction heating method in an argon atmosphere and heated up to a temperature of 1300° C. The resultant melt was trickled from a nozzle positioned under the graphite crucible, and concurrently, a highly-pressurized argon gas at 80 kg/cm² was sprayed on the trickled melt so that the melt would be transformed into alloy droplets, which were further struck against a cone-shaped rotatable cooling member which rotated at 5000 rpms positioned beneath the nozzle. Thus, the alloy powder was obtained. The amount of copper contained in the alloy powder measured by the ICP method was 97 on the overall average (atomic composition percentage, A. C. %).

EXAMPLE 2

700 g of copper powder (having a purity of 99.9% or greater) and 30 g of silver powder (having a purity of 99.9% or greater) were mixed and laid in a graphite crucible of a two-stage liquid cooling device. Then, the resultant mixture was melted by a high frequency induction heating method in an argon atmosphere and heated up to a temperature of 1200° C. The resultant melt was trickled from a nozzle positioned under the graphite crucible, and concurrently, argon gas highly-pressurized at 80 kg/cm² was sprayed on the trickled melt so that the melt would be transformed into alloy droplets, which were further struck against a cone-shaped rotatable cooling member which rotated at 5000 rpms positioned beneath the nozzle. Thus, the alloy powder was obtained. The amount of copper contained in the alloy powder measured by the ICP method was 80 on the overall average (atomic composition percentage, A. C. %).

Comparative Example 1

950 g of copper powder (having a purity of 99.9% or greater) and 50 g of silver powder (having a purity of 99.9% or greater) were mixed and laid in a graphite crucible of a two-stage liquid cooling device. Then, the resultant mixture was melted by a high frequency induction heating method in an argon atmosphere and heated up to a temperature of 1300° C. The resultant melt was trickled from a nozzle positioned under the graphite crucible, and concurrently, argon gas highly-pressurized at 80 kg/cm² was sprayed on the trickled melt, which was then cooled. Thus, the alloy powder was obtained.

Comparative Example 2

700 g of copper powder (purity of 99.9% or greater) and 30 g of silver powder (purity of 99.9% or greater) were mixed and laid in a graphite crucible of a two-stage liquid cooling device. Then, the resultant mixture was melted by a high frequency induction heating method in an argon atmosphere and heated up to a temperature of 1200° C. The resultant melt was trickled from a nozzle positioned under the graphite crucible, and concurrently, a highly-pressurized argon gas at 80 kg/cm² was sprayed on the trickled melt, which was then cooled. Thus, the alloy powder was obtained. The alloy powder of Comparative Examples 1 and 2 were produced by employing the high-pressure atomizing method.

An explanation will now be given of the results of the analyses of the alloy powder of the embodiments and that of the comparative examples described above.

Figure 1:
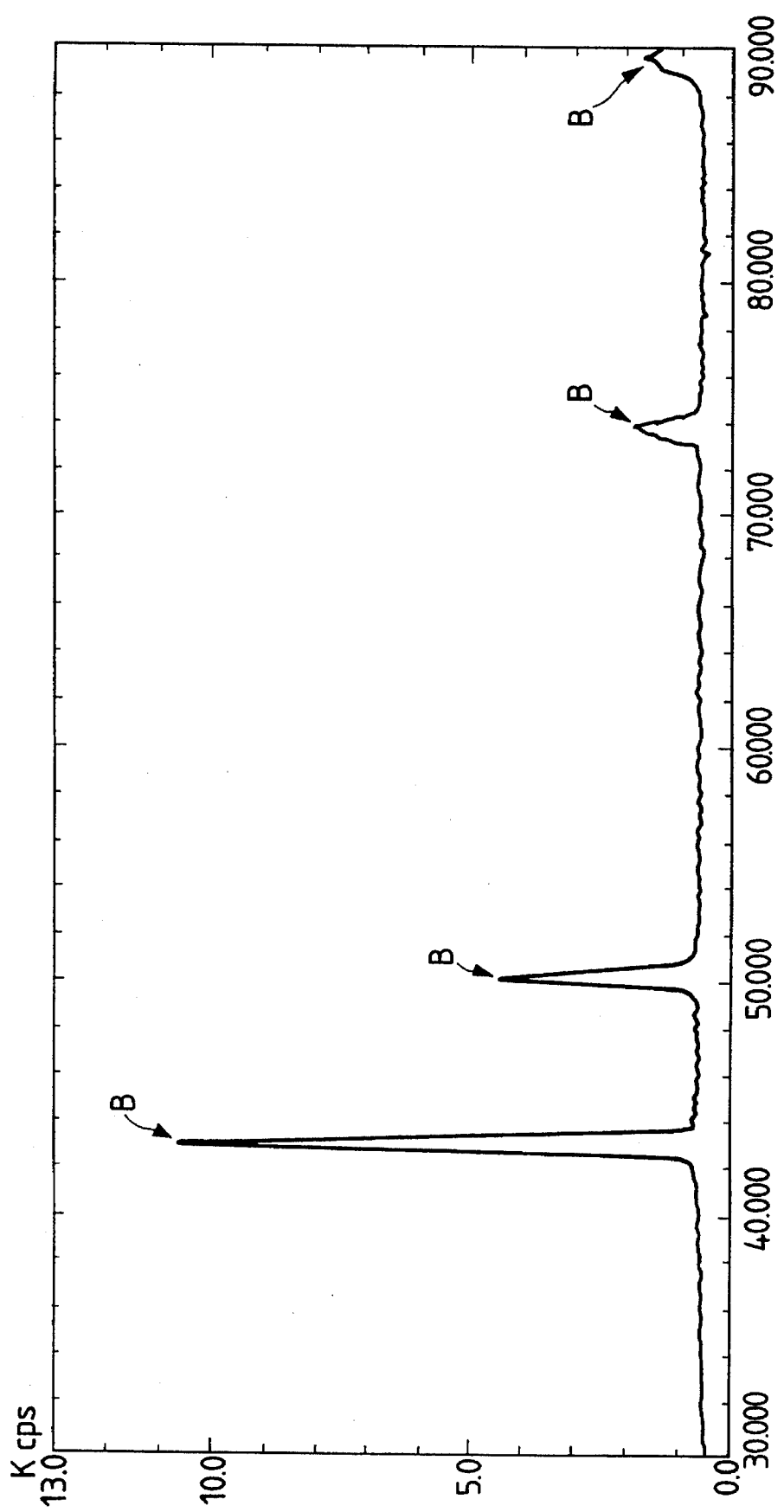
FIG. 1 is a graph showing an X-ray diffraction pattern of alloy powder of the present invention in Example 1.
Figure 2:
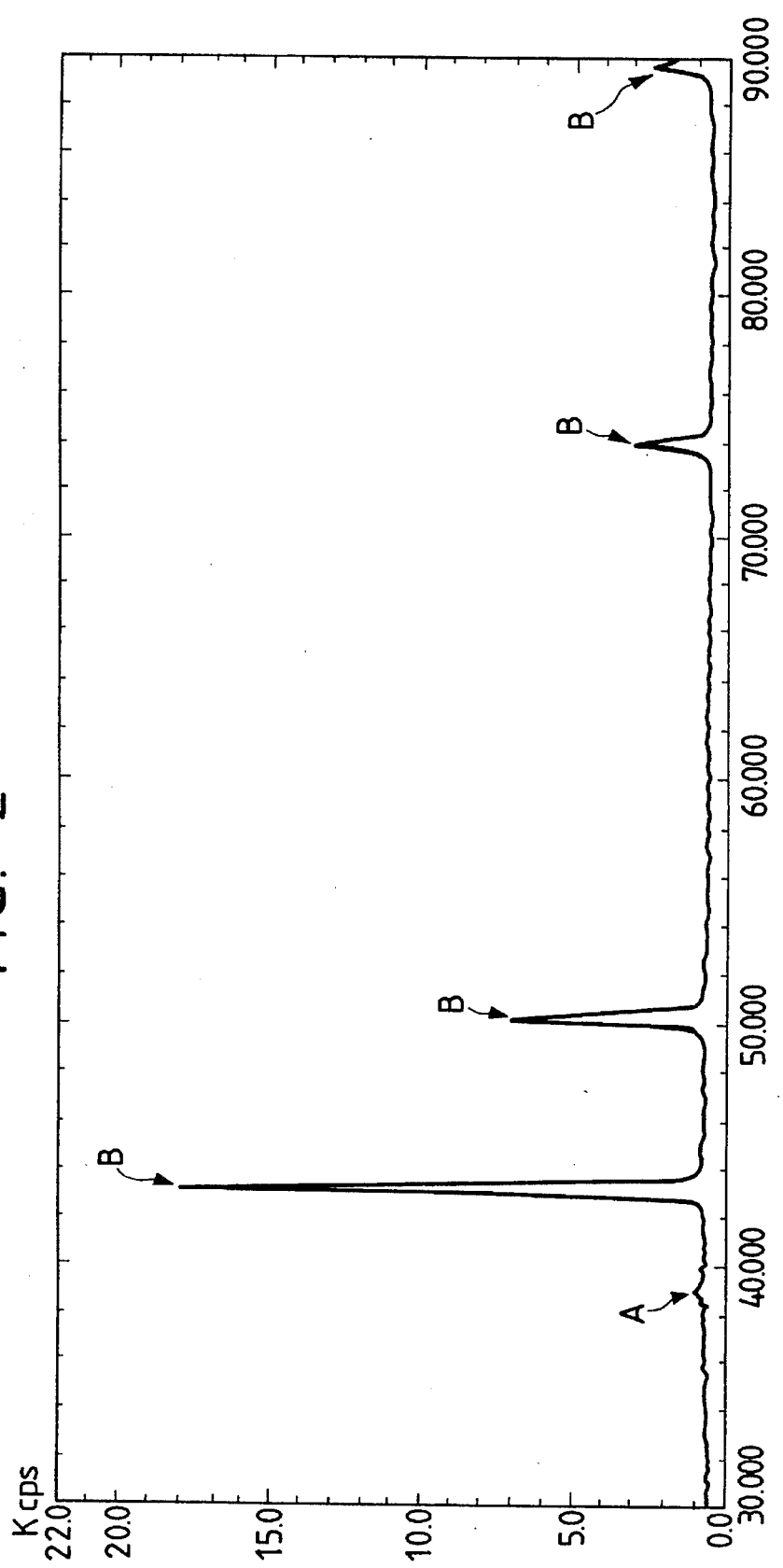
FIG. 2 is a graph indicating an X-ray diffraction pattern of alloy powder in Comparative Example 1.
Figure 3:
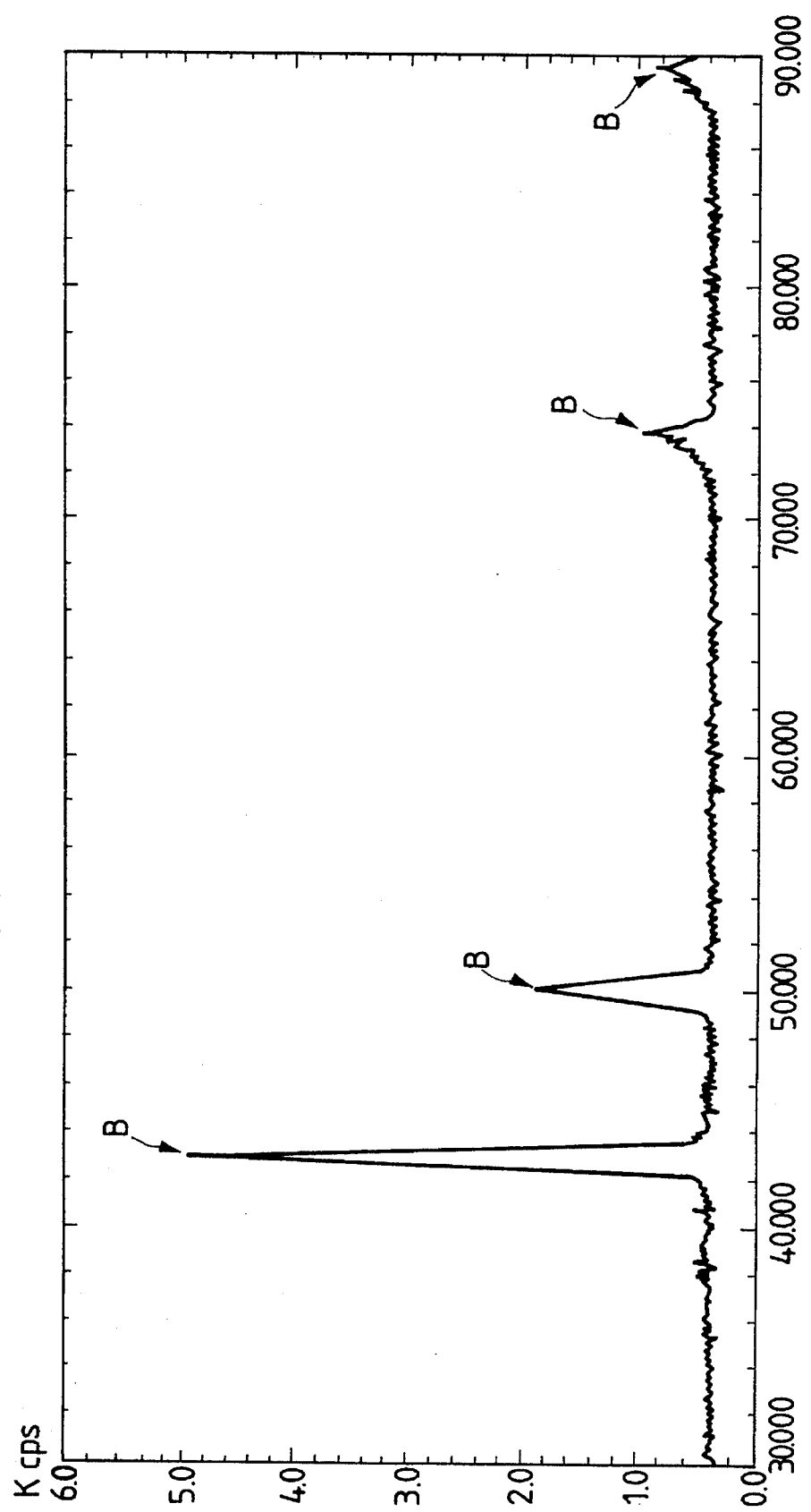
FIG. 3 is a graph showing an X-ray diffraction pattern of alloy powder of the present invention in Example 2.
Figure 4:
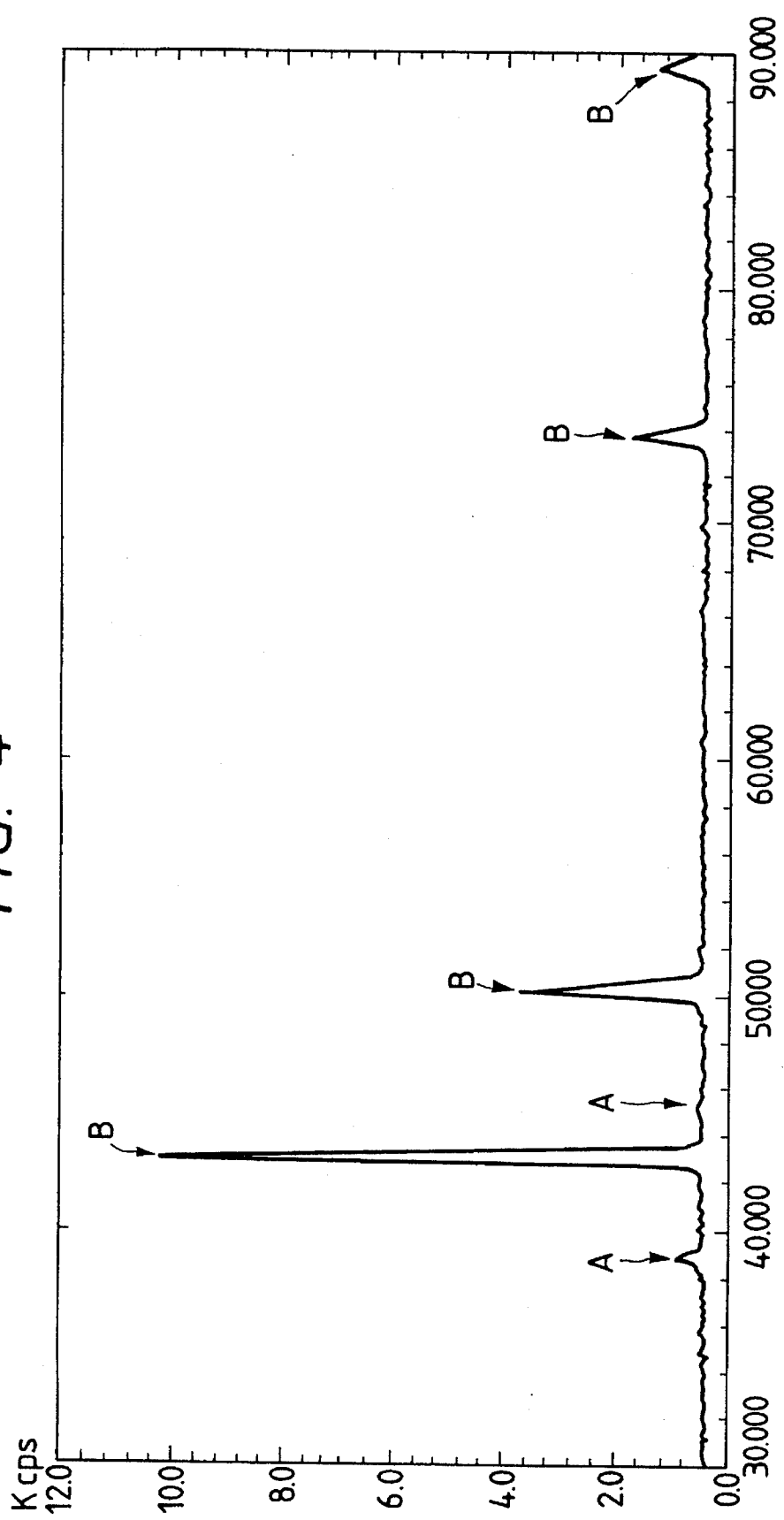
FIG. 4 is a graph indicating an X-ray diffraction pattern of alloy powder in Comparative Example 2.

The crystal structure of the alloy powder of the present invention was analyzed by utilizing an X-ray diffraction device whereby it was confirmed that copper is supersaturated with silver dissolved therein in the alloy powder of the present invention. FIG. 1 shows an X-ray diffraction pattern obtained from the alloy powder ($Cu_x Ag_{1-x}$ X=0.97) in Embodiment 1. It is verified from FIG. 1 that the alloy powder is a single-phase alloy formed of a solid solution in which copper is supersaturated with silver dissolved therein (a peak indicated by B). FIG. 2 indicates an X-ray diffraction pattern obtained from the alloy powder produced by employing the high-pressure atomizing method in Comparative Example 1. It is seen from FIG. 2 that a phase in which silver is supersaturated with copper dissolved therein (a peak indicated by A) appears at approximately 39°. FIG. 3 represents an X-ray diffraction pattern obtained from the alloy powder ($Cu_x Ag_{1-x}$ X=0.80) of the present invention in Embodiment 2, and FIG. 4 shows an X-ray diffraction pattern of the alloy powder in Comparative Example 2. In comparison with these two examples, it is also validated that the alloy powder of the present invention is formed of a single-phase supersaturated solid solution. It is still further verified that the grain growth is inhibited from the fact that the peak is comparatively broad. The conditions of measuring the X-ray diffraction pattern are as follows.

X-ray tube: Copper

Tube voltage: 40 KV

Tube current: 30 mA

Sampling pitch: 0.020°

Scanning speed: 4.000°/min

The results of the oxidation test on the surface of the alloy powder will now be described. The alloy powder of Example 1 and that of Comparative Example 1 were left in a room for 3 months, and then the two types of the alloy powder were examined with respect to what extent they were oxidized by utilizing an Auger electron analyser (AES) employed by the following method.

Device: 590 A made by ULVAC PHI

Method of fixing a sample: metal powder was embedded in a indium film.

Measuring conditions: acceleration voltage 5 KV, sample current 20 nA, inclination 45°

Etching conditions: An argon ion was accelerated at 2 KV. At this time, the etching rate was approximately 7.5 nm/min when $SiO_2$ is used.

Figure 5:
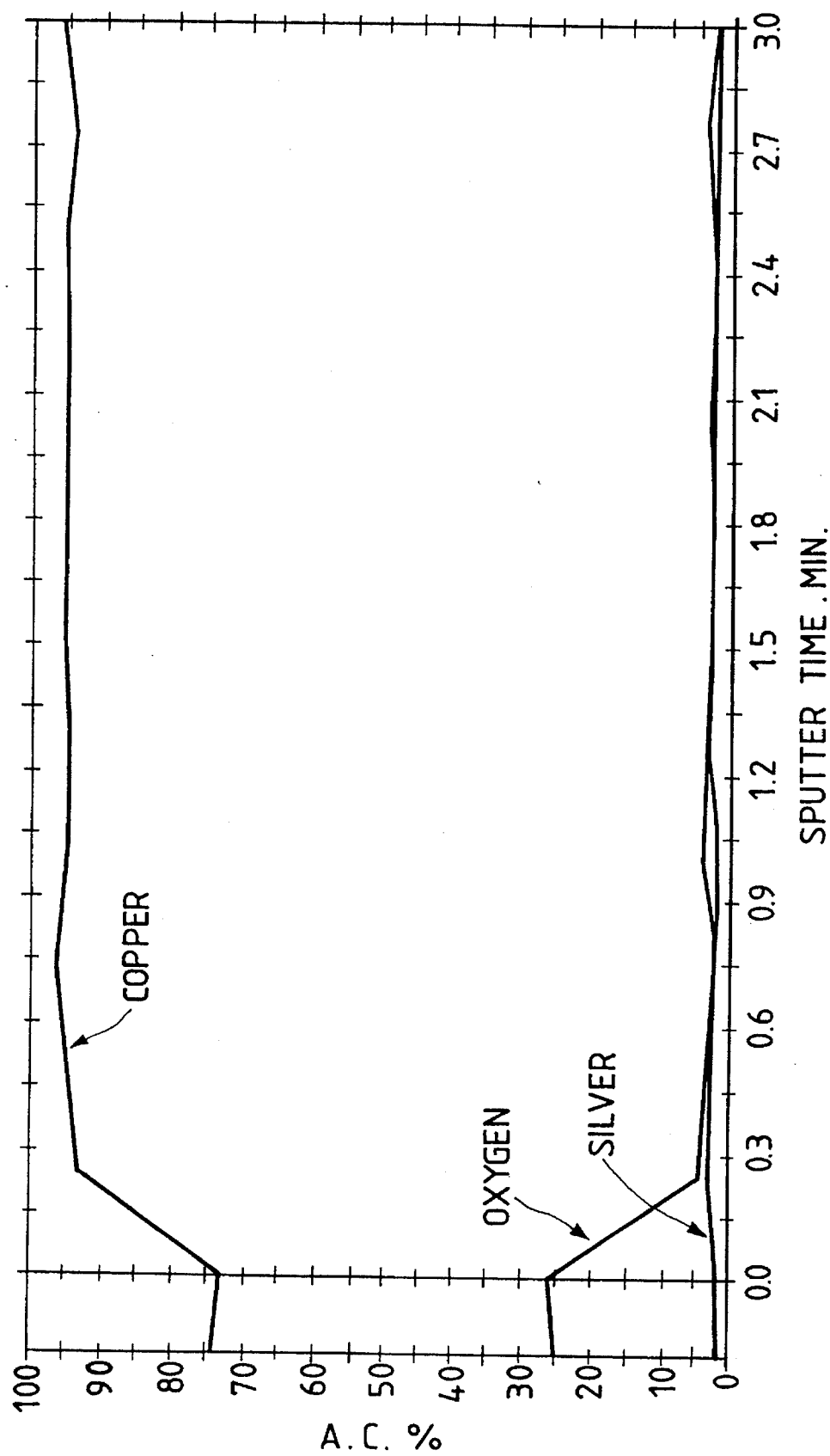
FIG. 5 is a graph representing data of the alloy powder of the present invention in Example 1 measured by an Auger electron analyser (AES)
Figure 6:
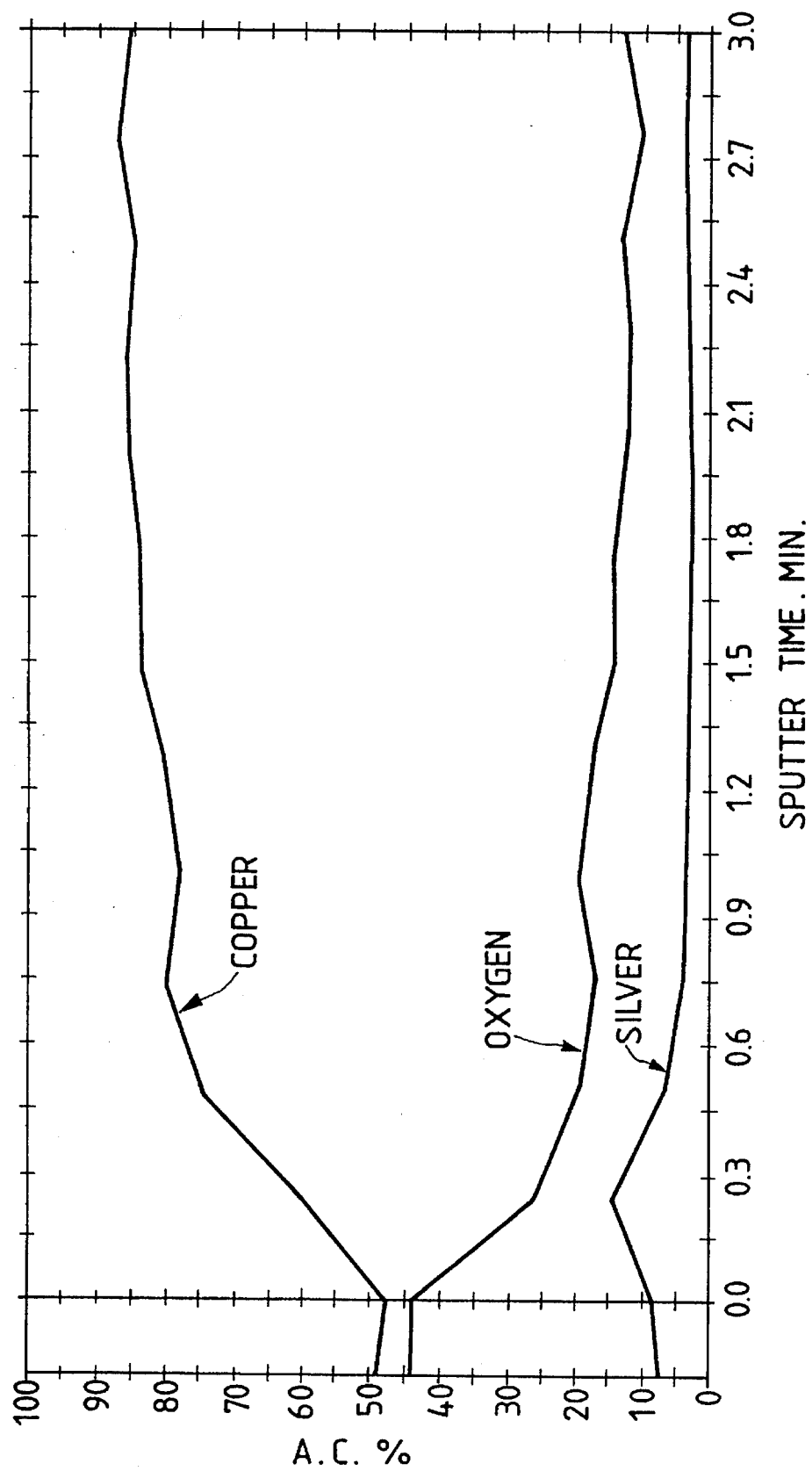
FIG. 6 is a graph showing data of the alloy powder in Comparative Example 1 measured by the AES.

FIG. 5 shows measurement data of the alloy powder of Example 1, and FIG. 6 indicates that of Comparative Example 1. As will be clearly seen from the data, there is a lesser amount of oxygen detected both on the surface and inside of the alloy powder of Example 1 than that of Comparative Example 1. Thus, it is validated that the alloy powder of the present invention is less likely to be oxidized than the alloy powder produced by the high-pressure atomizing method.

Such an advantage might be due to the following reasons. That is, the copper alloy powder of the present invention is produced by super-quenching. As will be clearly understood from the X-ray diffraction pattern as previously discussed, the copper alloy powder is consequently formed of a supersaturated solid solution having a homogeneous structure, thus inhibiting the grain growth and increasing the number of the grain boundaries, which results in a decrease in the energy of the grain boundaries per unit of the crystal system. That is, the alloy powder is stabilized on the energy level, and thus it is unlikely to be oxidized. It should be noted that such reasons are merely inferential and do not limit the rights of the present invention.

A characteristic of electromigration of the present invention will be referred to in a description of embodiments and test results of a dispersion-type conductor which will be discussed afterwards. This is because it is more practical to evaluate such a characteristic when the alloy powder is applied to a conductor rather than to evaluate the alloy powder per se.

An explanation will now be given of a dispersion-type conductor using the alloy powder of the present invention.

It is possible to use the aforementioned mode of the alloy powder used for the dispersion-type conductor of the present invention. The average grain diameter of the usable alloy powder is desirably between 0.1–300 μm. Within this range, the alloy powder can be processed into ink, paint and paste by adding an inorganic binder or the like. When the alloy powder is processed into paste for screen printing, the grain diameter is preferably between 1–10 μm. If the grain diameter is 0.1 μm or less, the energy level on the surface of the alloy powder is increased, thus giving rise to oxidization on the surface and resulting in a rise in the resistance of the dispersion-type conductor. If the grain diameter exceeds 300 μm, it will be difficult to process the alloy powder into a paste or the like. The alloy powder produced by employing the two-stage liquid cooling method is formed in a flat shape, and consequently, it has a greater contact area among the grains of the powder in the dispersion-type conductor compared to the spherical alloy powder. Thus, the flat-shaped alloy powder can reduce the resistance value to a lower level than the spherical alloy powder although both types of the alloy powder have the same composition ratio. Organic and inorganic binders can be used for the alloy powder of the present invention. The organic binders include a thermosetting resin, a thermoplastic resin, and a mixture of two or more kinds of such resins. The mixture includes a resin blend of at least two components, and a resin of at least one component dispersed in another component. The type of the organic binders is usually selected depending on the type of a material forming a base to which the dispersion-type conductor adheres. For example, when the dispersion-type conductor is formed on a phenol base, the following resins are suitable for the organic binders added to the alloy powder: a phenol resin, an epoxy resin, a melamine resin, and the like, and a mixture of at least two or more kinds of such resins. When the base is made of a polyester film, the following resins are suitable for the organic binders: a polyester resin, an urethane resin, an epoxy resin, and the like, and a mixture of at least two kinds of such resins. When the dispersion-type conductor is desirably provided with injection molding and powder molding characteristics, the following resins are suitable for the organic binders: nylon, an acrylic resin, polycarbonate resin, and the like, and a mixture of at least two kinds of such resins. The inorganic binders include lead glass, aminosilicate glass, borosilicate lead glass, and the like. Or two or more types of these components may be used. The organic binders are often added when the alloy powder is processed into paste or the like.

The dispersion-type conductor of the present invention is useful in a composition ratio of 100 parts by weight of the copper alloy powder to between 5–100 parts by weight of the amount of the binder. Less than 5 parts by weight of the binder is not enough to bind the grains of the copper alloy powder in the dispersion-type conductor, thus reducing the mechanical strength in the conductor. On the other hand, if the amount of the binder is more than 100 parts by weight, that is, a reduction in the amount of the copper alloy, the contact area among the grains of the alloy powder is smaller, and thus sufficient conductivity cannot be obtained. The amount of the binder is preferably between 10–40 parts by weight.

The dispersion-type conductor of the present invention is processed into paste, paint and ink by mixing the alloy powder and the binder, and by further adding various materials if necessary. For instance, a vehicle is prepared beforehand by dissolving an organic binder into a solvent. The alloy powder is added into the vehicle, and they are kneaded and dispersed by a ball mill or a three-roll mill, or the like so as to be transformed into a paste or the like. If necessary, a known additive for improving various characteristics of the paste is mixed in during any of the processes for producing the paste. Such additives include a levelling agent, an antifoaming agent, a thixotropic imparting agent, a sedimentation inhibitor, and a combination of at least two kinds of these additives.

The resultant paste is applied to an insulating base or the like by a known method, such as a screen printing, and then solidified by employing a method depending on the type of a binder, for example, by air drying or heatcuring in the case of an organic binder, thereby obtaining the targeted dispersion-type conductor. The following is a description of an embodiment of the dispersion-type conductor.

EXAMPLE 3

An epoxy-modified urethane resin (U-500 made by Asahi Denka Kogyo K.K.) was dissolved in methyl ethyl ketone (MEK) in a ratio of 1:2 so as to produce a vehicle. 90 parts by weight of the vehicle to which an additive such as an antifoaming agent or the like is further added and 100 parts by weight of the alloy powder produced in Example 1 were kneaded by a three-roll mill, thereby producing a paste. Such paste was screen-printed on a PET film (125 μm) and then dried at room temperature. Thus, the dispersion-type conductor which consists of a plurality of parallel conductors and which has a pattern pitch of 0.4 mm and a thickness of 10 μm was formed.

Comparative Example 3

The dispersion-type conductor which consists of a plurality of parallel conductors and has a pattern pitch of 0.4 mm and a thickness of 10 μm was formed in a similar manner to Example 3 except that the alloy powder produced in Comparative Example 1 was used in lieu of the alloy powder in Example 3.

The results of the evaluation of the electromigration characteristic will now be discussed. The conductivity of the dispersion-type conductor was measured by a four-terminal method. The test was performed by the following method. A waterdrop of approximately 0.2 ml was trickled between the two dispersion-type conductors of both samples of the conductors using the powder alloy produced in Example 3 and Comparative Example 3 (at this time, it should be noted that the waterdrop be trickled so as to fully contact both of the two dispersion-type conductors). Then, DC voltage of 5 V was applied to the two conductors. Thus, the respective DC currents (leakage currents) flowing in the two conductors were measured with the lapse of time. An increase in the leakage current with the lapse of time shows electromigration occurs and progresses in the two conductors.

Figure 7:
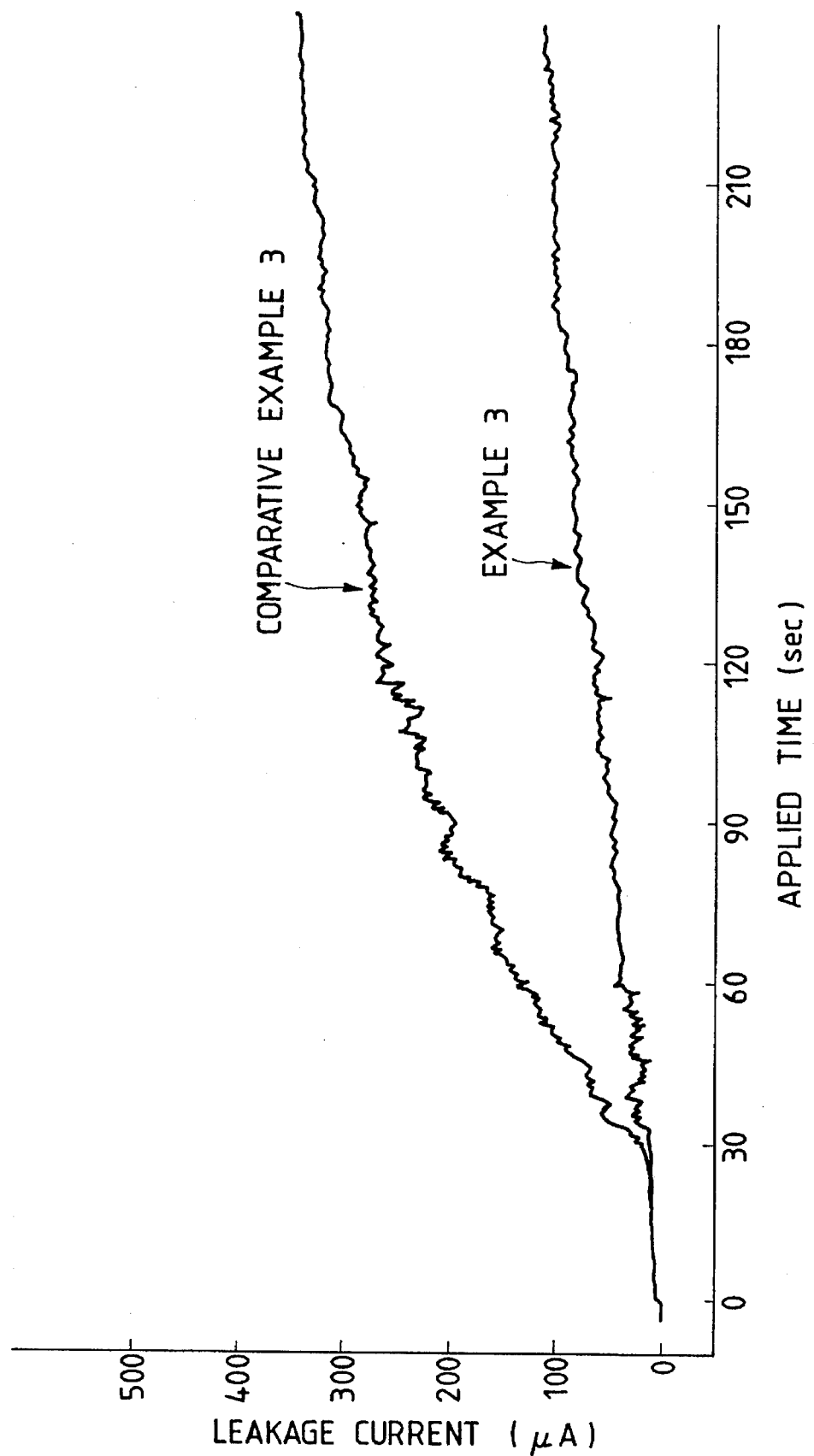
FIG. 7 is a graph indicating data of the evaluation test of electromigration in the alloy powder of Example 3 according to the present invention and that of Comparative Example 3.

FIG. 7 is a graph showing the results of the evaluation test of electromigration. As it is clearly seen from the graph, an increase in the leakage current with the lapse of time is much less distinct in the dispersion-type conductor of Example 3 than that of Comparative Example 3, and consequently, the progress of electromigration in the former conductor is less than that of the latter.

The dispersion-type conductor of the present invention may be applicable to the use of conductors, such as electromagnetic-wave shielding materials, circuit substrates, membrane switches, and various other kinds of electronic parts.

While the present invention has been described by specifying various conditions, it is to be understood that the invention is not restricted by such conditions, but may be applicable without departing from the spirit of the invention.

As will be clearly understood from the foregoing description, the present invention offers the following advantages.

The present invention constructed as stated above can provide reasonable alloy powder which is unlikely to be oxidized on the surface. Also, the use of the alloy powder of the present invention makes it possible to obtain a dispersion-type conductor having high electric conductivity and in which electromigration is very unlikely to occur.

What is claimed:

1. An atomized alloy powder having a composition expressed by a chemical formula $Cu_x Ag_{1-x}$ (where $0.80 \leq x \leq 0.95$ at an atomic ratio and a homogeneous, single-phase supersaturated solid solution structure such that copper is supersaturated with silver dissolved therein.

2. A dispersion-type conductor comprising 100 parts by weight of an atomized alloy powder and between 5–100 parts by weight of a binder in which said atomized alloy powder is dispersed;

said atomized alloy powder having a composition expressed by a chemical formula $Cu_x Ag_{1-x}$ (where $0.80 \leq x \leq 0.95$ at an atomic ratio and a homogeneous, single-phase supersaturated solid solution structure such that copper is supersaturated with silver dissolved therein.

* * * * *